United States Patent [19]
Kresge et al.

[11] Patent Number: 5,829,124
[45] Date of Patent: Nov. 3, 1998

[54] METHOD FOR FORMING METALLIZED PATTERNS ON THE TOP SURFACE OF A PRINTED CIRCUIT BOARD

[75] Inventors: John Steven Kresge, Binghamton, N.Y.; David Noel Light, Friendsville, Pa.

[73] Assignee: International Business Machines Corporation, Armonk, N.Y.

[21] Appl. No.: 580,678

[22] Filed: Dec. 29, 1995

[51] Int. Cl.$^6$ .................................................. H05K 3/34
[52] U.S. Cl. .............................. 29/840; 29/832; 174/250
[58] Field of Search ........................ 29/840, 832, 825, 29/830; 428/901; 174/255, 250

[56] References Cited

U.S. PATENT DOCUMENTS

| | | | |
|---|---|---|---|
| 3,424,698 | 1/1969 | Lupinski et al. | 252/500 |
| 3,781,596 | 12/1973 | Galli et al. | |
| 3,832,769 | 9/1974 | Olyphant, Jr. et al. | |
| 3,986,939 | 10/1976 | Prest | 204/15 |
| 4,016,050 | 4/1977 | Lesh et al. | 204/15 |
| 4,393,576 | 7/1983 | Dahlberg | 156/233 X |
| 4,648,179 | 3/1987 | Bhattacharyya et al. | |
| 4,832,255 | 5/1989 | Bickford et al. | 228/53.3 X |
| 4,851,614 | 7/1989 | Duncan, Jr. | 174/68.5 |
| 4,879,156 | 11/1989 | Herron et al. | 428/137 |
| 5,015,538 | 5/1991 | Krause et al. | 428/626 |
| 5,113,579 | 5/1992 | DiBugnara | 29/840 |
| 5,116,459 | 5/1992 | Kordus et al. | 156/631 |
| 5,239,448 | 8/1993 | Perkins et al. | 361/764 |
| 5,305,523 | 4/1994 | Bross et al. | 29/840 X |
| 5,306,872 | 4/1994 | Kordus et al. | 174/250 |
| 5,323,947 | 6/1994 | Juskey et al. | 228/56.3 |
| 5,338,900 | 8/1994 | Schneider et al. | 174/250 |
| 5,356,526 | 10/1994 | Frankenthal et al. | 205/122 |
| 5,384,952 | 1/1995 | Matsui | 29/840 |
| 5,611,140 | 3/1997 | Kulesza et al. | 29/840 X |

FOREIGN PATENT DOCUMENTS

| | | | |
|---|---|---|---|
| 2-98190 | 4/1990 | Japan | 29/840 |
| 5-114448 | 5/1993 | Japan | 29/840 |
| 6-45740 | 2/1994 | Japan | 29/840 |

*Primary Examiner*—Carl J. Arbes
*Attorney, Agent, or Firm*—Baker Maxham Jester & Meador

[57] ABSTRACT

A method for attaching pads to a high density printed circuit board (PCB) having a plurality of through-holes opening on the top surface. The method includes forming a plurality of pads on a carrier sheet so that each of said pads have a copper layer proximate to said carrier sheet and a joining metal layer formed on top of said copper layer, positioning the plurality of pads on the carrier sheet so that they are aligned with the through-hole pattern on the top surface of the PCB, laminating the pads to the through-holes on the top surface using the joining metal, and separating the carrier sheet from the plurality of pads that are joined to the through-holes so that the copper layer is exposed. The pads may comprise a variety of shapes such as disk-shaped, elongated, or rectangular, and can cover one or multiple through-holes. An electrical component may be soldered to the pad. The method advantageously prevents wicking of the solderball volume into the through-hole, thereby increasing yield and part reliability. In one embodiment, the pad and through-hole may be compressed so that the top surface of the pad is even (flush) with the top surface of the external dielectric surface.

55 Claims, 4 Drawing Sheets

METHOD FOR FORMING METALLIZED PATTERNS ON THE TOP SURFACE OF A PRINTED CIRCUIT BOARD

BACKGROUND OF THE INVENTION

1. Field of the Invention

The present invention relates to forming metallized patterns on the top surface of high density printed circuit boards (PCBs) and particularly to forming metallized features on multilayer printed circuit boards having electrically conductive through-holes that open to an external surface.

2. Description of the Related Art

Multilayer printed circuit boards, including the high density type, include several electrically conductive layers separated by layers of dielectric material. Some of these conductive layers are utilized as power planes while other conductive layers may be patterned for electrical signal connections (e.g. between integrated circuit chips). Multilayer circuit board constructions are manufactured by combining a plurality of smaller, independently formed circuit board structures termed "core assemblies" or just "cores". The manufacturing process for each core includes etching predetermined conductive layers in a predetermined pattern and laminating them together to form a core assembly. Each core assembly is manufactured and tested separately before being laminated into a multilayer structure with the other cores. The finished core assemblies are aligned and then laminated together in a complex process that includes application of heat and pressure to close gaps created by accumulated process and material tolerances, and to assure intimate contact for all through-holes and mechanical bonding of the external dielectric layers.

In those situations where electrical interconnections are desired between adjacent conducting layers, it has been common in the art to provide such connections with "plated-through-holes" (PTHs), sometimes referred to as "through-holes" or "vias". Conventionally, through-holes are formed only after the cores have been laminated to form a complete multilayer structure, by drilling an aperture in the multilayer structure and electro-plating the interior to electrically connect the conductive layers through which the through-hole has been drilled. In an improved process, such as described in U.S. Pat. No. 5,359,797, to Chen, et al., the through-holes are formed separately in each core before forming a multilayer structure by drilling an aperture in each core and then electro-plating the interior and an area surrounding the opening to form a conductive through-hole and via lands. When the core assemblies are aligned to prepare for lamination, the apertures in each core become aligned to define a through-hole. After lamination, the through-holes formed in the multilayer structure can extend through multiple cores, and sometimes open on the top external surface, the bottom external surface, or both of the external surfaces of the multilayer structure. As used herein, the term "through-hole" is meant to include all types of through-holes and vias, including PTHs that open to an external surface.

Multilayer electronic structures require a plurality of mounting sites or pads formed on one or both external surfaces, which are used for mounting an electronic device such as a semiconductor chip to the multilayer circuit board. Particularly, the mounting structures provide a way for the electronic device to connect with signal lines, power planes, and any other structures in the multilayer circuit board. The mounting sites comprise an electrically conductive material and have a predetermined pattern to function as ground, power, and/or signal sites, for example. Usually, the pattern of mounting sites is designed to match the pattern of power, ground, or signal sites on the attached device. Frequently, the mounting sites are electrically connected to plated through-holes that open externally from the multilayer circuit board.

As the dimensions of electrical circuit components have been reduced, the density of the ground, power, and signal sites on the chip to be attached to a printed circuit board (or card or chip carrier) have also increased. This increased density of the components to be attached unfortunately requires increased density on the mounting surface of the circuit board. For example, direct chip attachment methods may require the pads to which they attach to be on a very fine area array pitch (e.g. 8 mil center-to-center spacing between pads). Another example of an instance where a fine array pitch may be required is a high I/O module.

The presence of a through-hole opening in a circuit board can cause problems while connecting the component to the circuit board, including wicking of the molten solder into the metallized through-hole. One result of such wicking is reduced solderball volume, which unfavorably decreases assembly yield and interconnect reliability.

If the component grid is large enough, the wicking problem can be solved by elongating the via land, or utilizing a 'dogbone' shaped pad in conjunction with a soldermask, to provide an assembly pad physically isolated from the via yet electrically commoned to it. As a result the mounting (or assembly) pad is offset from the through-hole grid.

However, where the component grid is very fine, there may be no available space to offset the mounting pad. In other words, a very fine grid may not have sufficient space to resolve circuitized features interstitially, nor to resolve the soldermask image necessary to 'dam' solder away from the vias. Particularly in these instances, a method is needed to form solder interconnections between the component and carrier directly above (rather than offset from) these through-holes. Arranging the mounting pads directly over the drilled holes provides a maximum density of input and output sites and eliminates the need for a solder mask. However, placing solder balls or mounting chips directly over through-holes, or even close thereto, requires a method for plugging the through-holes to prevent solder from wicking away from the joint and into the through-hole to avoid the wicking problem.

Kamperman, in U.S. patent application Ser. No. 08/352,144, filed Dec. 1, 1994, discloses a method for capping externally-opening through-holes in multilayer structures. Kamperman discloses first depositing a bonding metal on a copper layer in a predetermined pattern that matches the through-hole openings, and then bonding the metal to the multilayer structure, including covering the externally-opening through-holes. Finally, the copper layer in the multilayer structure is etched in a predetermined pattern for the purpose of providing mounting sites for components or other structures.

This final step unfortunately increases part cost by reducing the yield of a (by now) very expensive composite multilayer structure. The more complex the pattern to resolve on the surface, the greater the yield loss will be. For example, the yield loss of this final step could be 10% for some high density patterns. Furthermore, the entire nearly completed multilayer structure is subjected to potentially damaging chemical intrusion and mechanical stresses. If damaged, the part must be thrown away, and yield decreases accordingly.

Another disadvantage of the process disclosed by Kamperman et al. is that, because the copper layer is in place during lamination and cannot extend below the external dielectric surface adjacent to it and the copper layer forms part of the final pad, the pad cannot be formed flush with the external dielectric surface.

SUMMARY OF THE INVENTION

A method is described herein for attaching a plurality of pads to a high density printed circuit board that has a plurality of through-holes opening on its top surface. A plurality of pads are formed in a predetermined pattern on a carrier sheet so that each pad has a copper layer proximate to the carrier sheet and a joining metal layer formed thereon. The plurality of pads are positioned in alignment with the through-hole pattern on the top surface of the circuit board. The pads are laminated to the through-holes on the top surface using the joining metal. Finally, the carrier sheet is separated from the pads to expose the copper layer.

A method for capping through-holes in a printed circuit board structure is described herein that includes forming a pattern of copper pads on a grid equivalent to the grid on a component's bottom surface. The pads are plated in a predetermined pattern on a peelable carrier sheet, and are then joined to a predetermined external surface (i.e., the top or bottom) of the printed circuit board. In one embodiment, the printed circuit board comprises a multilayer structure, and the pads are joined to the multilayer structure during the same joining process used to join the cores to form the multilayer structure.

The pads are formed into a pattern predetermined by design requirements such as the components (if any) to be attached thereto and the spacing of the through-hole grid upon which the pads will be affixed. The pad pattern may include a variety of shapes including disk-shaped pads that cover one through-hole and elongated pads that connect two or more through-holes. The carrier layer comprises a material that bonds loosely enough to the pads to allow the carrier layer to be peeled away while retaining the bond between the pad and the multilayer structure. One example of such a carrier layer is a polyimide film that has good dimensional stability (e.g. upilex™) or a smooth metal film such as stainless steel. The carrier layer is preferably flexible enough to allow it to be peeled away from the multilayer structure. In some embodiments, if the multilayer structure is flexible enough, the carrier layer may be relatively inflexible, such as a block of stainless steel.

The carrier layer is peeled off following the joining operation, exposing the top (copper) layer of the metal pads, which have been joined to the via lands on the external surface. In the resulting structure, the through-holes on the top core are capped by the pads. In the embodiment wherein the printed circuit board is formed from multiple cores, the pads are joined to the via land using the same joining metallurgy used to join core to core (e.g. gold-tin transient liquid phase bonding). The exposed copper top facilitates soldering a component or a mounting structure thereto.

One advantage of providing a peelable carrier that can be inspected ahead of time to verify its integrity, is that it ensures that the part is good before is bonded, thereby ensuring an extremely high yield of the final product. In some instances, the yield may approach 100%. As another advantage, the present invention, by not etching a nearly complete circuit board, avoids unwanted chemical intrusion and mechanical stress.

In one embodiment, the lamination process provides a combination of pressure and heat sufficient to compress the through-holes and pads bonded thereto to embed the pads into the dielectric, and as a result that the pads are flush with the top surface of the dielectric. A pad that is flush with the dielectric has advantages during later processing of the multilayer circuit board, including allowing a thinner soldermask to be placed over the pads, which provides easier resolution of features.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE PREFERRED EMBODIMENT

This invention is described in a preferred embodiment in the following description with reference to the figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Introduction and general discussion of multilayer structures

The following disclosure and associated drawings define a process for making a multilayer circuit board assembly from a plurality of core assemblies, termed "cores" herein, each of which is formed of a plurality of dielectric and conductive layers. The final assembly includes a plurality of cores joined together in a predetermined manner using heat and compression to provide an end product having the operational characteristics (e.g., wiring density and resistance) desired for any given particular design. In the following figures and discussion, various steps and structure for a multilayer circuit are shown in accordance with one embodiment of the invention. It should be understood that the configuration depicted in these figures is representative of only one version of such a multilayer circuit, and the invention is thus not limited thereto.

As is well known in the art, multilayer printed circuit board constructions typically utilize copper or a similar highly conductive material for the signal and/or power and/or ground conductive planes, the various through-holes and other conductive layers or lines. The term "printed circuit board" as used herein is thus meant to define a structure including at least one dielectric layer and at least one conductive layer located therein and/or thereon. One well known example of a dielectric material for use in such construction is fiberglass reinforced epoxy resin (e.g. FR4). Other dielectric materials include polyimide, polytetrafluoroethylene (PTFE), high temperature epoxies, BT resin, and cyanate esters.

Description of method of forming the plurality of pads on a peelable carrier sheet Reference is now made to FIGS. 1–7 to illustrate a series of steps of the preferred embodiment for forming a plurality of pads on a carrier sheet. While specific steps and processes are used to describe the preferred method, other steps and processes should be apparent to one skilled in the art.

Figure 1:
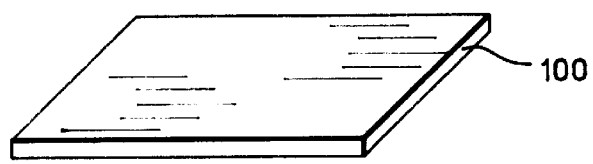
FIG. 1 is a perspective view of a carrier sheet.

FIG. 1 shows a flexible, peelable carrier sheet 100. The carrier sheet (or layer) comprises a material that bonds loosely enough to the pads to allow the carrier sheet to be peeled away while retaining the bond between the pad and the multilayer structure. One example of such a carrier layer is a polyimide film that has good dimensional stability (e.g. upilex™) or a smooth metal film such as stainless steel. The carrier layer is preferably flexible enough to allow it to be peeled away from the multilayer structure. In embodiments where the multilayer structure is flexible, the carrier layer can be relatively inflexible and may comprise a block of stainless steel, for example.

Figure 2:
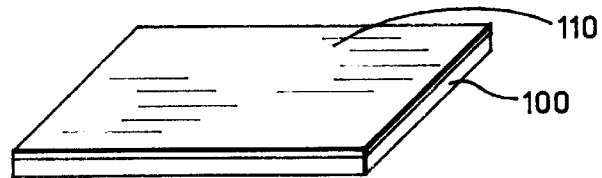
FIG. 2 is a perspective view of copper layer sputtered and flash-plated on the carrier sheet.

In the step illustrated in FIG. 2, a copper-sputtered layer 110 is sputtered and flash-plated on the carrier sheet 100 using conventional techniques.

Figure 3:
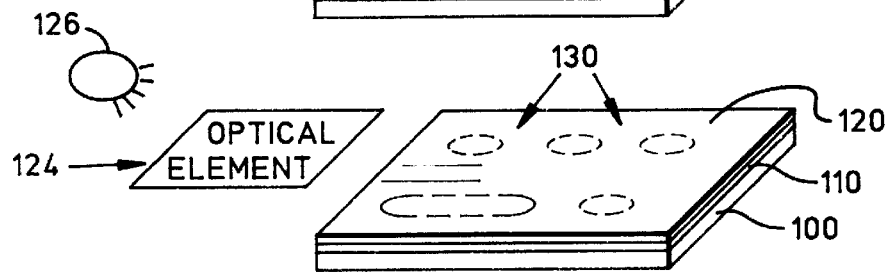
FIG. 3 is a perspective view of a photoresist layer applied over the copper layer, and a predetermined pad pattern and an ultraviolet (uv) light source for exposing the photoresist layer.

In FIG. 3, a layer of photoresist 120 has been applied covering the copper layer 110. An optical element 124, illustrated in block form, is used is used in conjunction with a light source 126 to expose the photoresist layer 120 with a predetermined pad pattern 130, one example of which is illustrated with dotted lines. The predetermined pad pattern is designed to meet attachment requirements of the components (if any) to be attached thereto, the location of the through-hole(s) to which the pads will be attached, the spacing of the through-hole grid, and electrical interconnections between through-holes. To meet these and other design requirements, the predetermined pad pattern may comprise a variety of shapes, for example, one or more of the pads may be disk-shaped, rectangular, cigar-shaped, or L-shaped.

Figure 4:
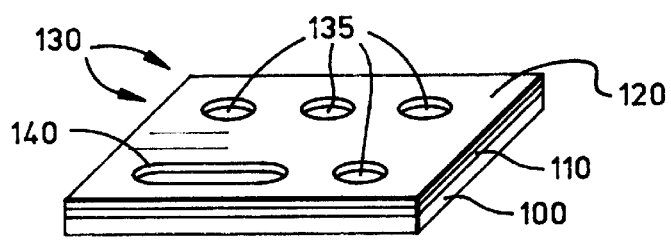
FIG. 4 is a perspective view of a plurality of exposed areas resulting from removing the unexposed photoresist.

In FIG. 4, the photoresist layer 120 that has been exposed with the predetermined pad pattern 130 is processed to remove the exposed material and thereby provide a plurality of exposed areas that correspond to the predetermined pad pattern 130. The exposed areas include a plurality of disk-shaped exposed areas 135 having a size and shape at least equal to the size and shape of the via lands to which they will be attached. The exposed areas also include an elongated pad 140 having a cigar-shape to cover multiple (e.g. two) through-holes.

Figure 5:
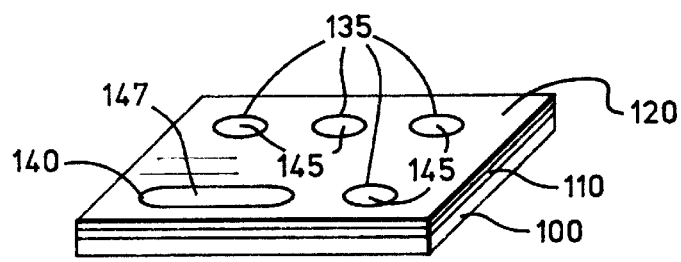
FIG. 5 is a perspective view of a plurality of copper layers formed in the plurality of exposed areas.

In FIG. 5, the exposed areas 135 and 140 are copper plated electrolytically, for example by an acid-copper process, to provide disk-shaped copper pad sections 145 within the disk-shaped exposed areas, and a cigar-shaped copper pad section 147 within the elongated pad area 140.

Figure 6:
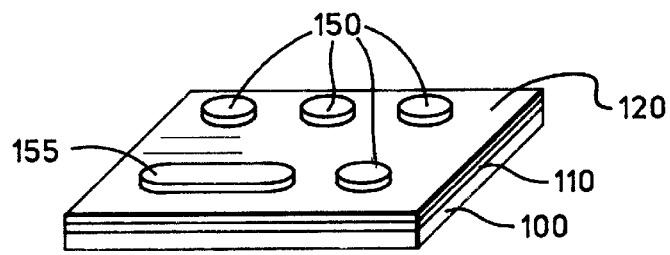
FIG. 6 is a perspective view of a plurality of pads formed by depositing a joining metal over the plurality of copper layers.

In FIG. 6, one or more joining metal layers, such as a gold layer and a tin layer are then plated over the copper pad sections in accordance with a predetermined bonding mechanism, such as transient liquid phase (TLP) bonding which will be described later in more detail. The resultant disk-shaped pads are illustrated at 150 and the resultant cigar-shaped pad is illustrated at 155.

Figure 7:
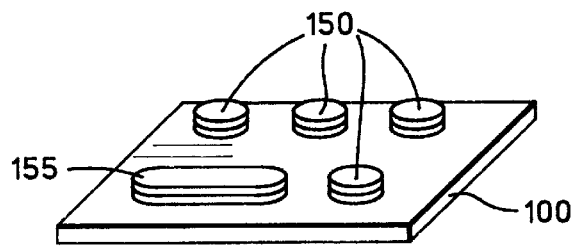
FIG. 7 is a perspective view of the pads formed peelable carrier sheet, with the remaining photoresist and the copper-sputtered layer removed.

In FIG. 7, the resist layer 120 is stripped using conventional means, and then the flashed copper layer 110 is etched away to leave the plurality of pads 150.

Figure 8:
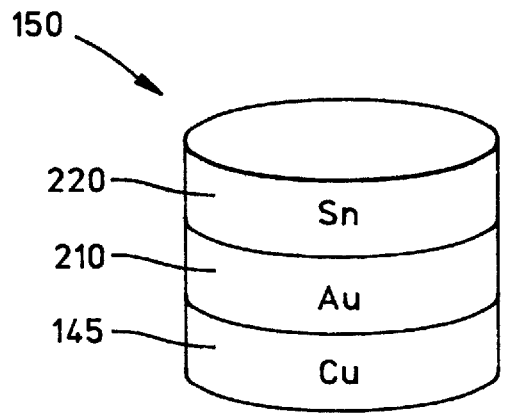
FIG. 8 is a perspective view of one of the pads in the preferred embodiment.

Reference is now made to FIG. 8, which illustrates one of the pads 150 in a preferred embodiment. The bottom layer formed of copper (Cu) is illustrated at 145, and is also shown in FIG. 5. For purposes of joining the pad 150 to the via lands, as will be described, joining metals are used in the layers above the copper layer 145. In one embodiment, a layer of gold (Au), shown at 210, has been deposited on the copper layer and a layer of tin (Sn), shown at 220, has been deposited on top of the gold layer 210. The joining metals shown in the layers 210 and 220 are preferably chosen to be compatible with bonding process for the multilayer structure so that the pads can be bonded to the multilayer structure simultaneously with formation of the multilayer structure. In the preferred embodiment, TLP (Transient Liquid Phase) bonding using gold-tin is utilized.

One example of a Transient Liquid Phase (TLP) process is disclosed in U.S. Pat. No. 5,280,414 to Davis et al. As described therein, the TLP process is a diffusion bonding process that involves deposition of different conductive surface metals which together are capable of forming a eutectic melt. The surfaces being bonded have a metallic surface comprising a highly conductive metal such as copper that is coated with the bonding metals. The two surfaces are brought into physical contact with one another and then heated to an initial eutectic temperature, which causes the bonding metals to melt and diffuse together in a percentage sufficient to form a first alloy that then solidifies at the initial eutectic temperature. The solidified first alloy is then heated to a greater temperature, causing it to melt and diffuse further with the adjacent bonding metal to form a second alloy through further diffusion, resulting in bonding of the metallic surfaces.

Figure 9:
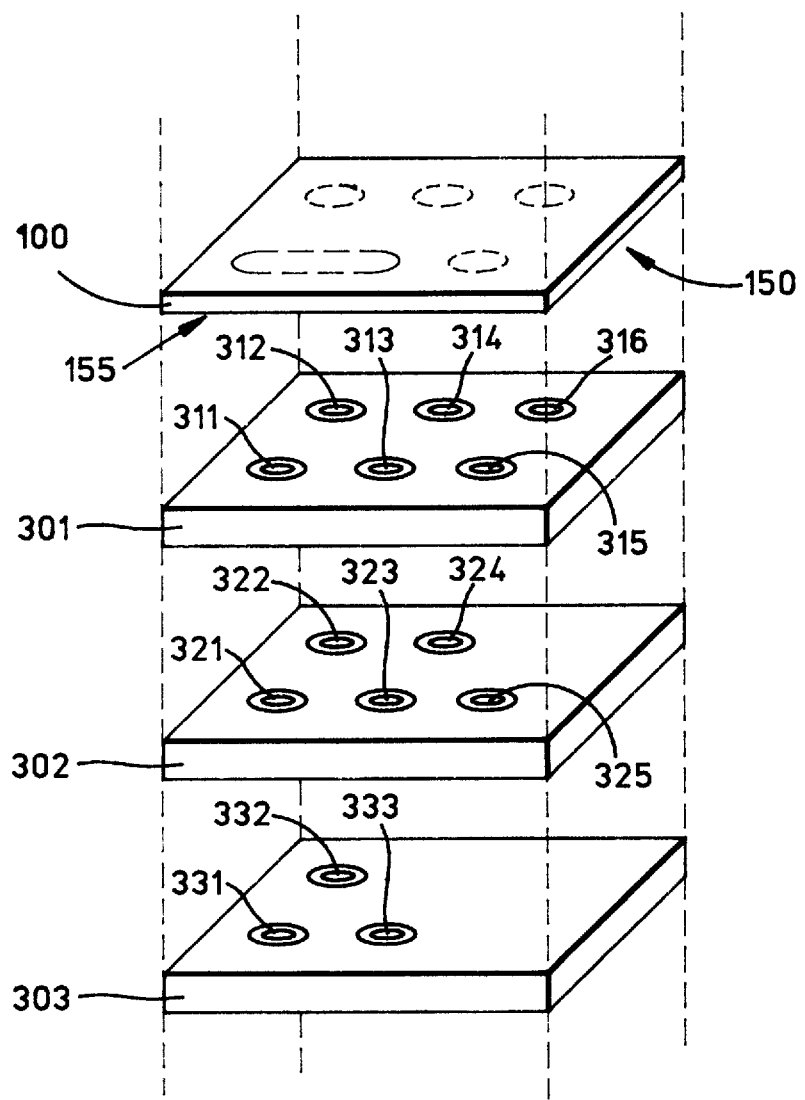
FIG. 9 is a perspective view of a plurality of cores aligned with the carrier sheet upon which the pads have been formed.

FIG. 9 is a perspective view of a plurality of cores, before lamination, in a position aligned with a carrier sheet 100 upon which the pads 150 and 155 have been formed. A first core 301 has a plurality of externally opening through-holes including a first through-hole 311, a second through-hole 312, a third through-hole 313, a fourth through-hole 314, a fifth through-hole 315 and a sixth through-hole 316. The first core 301 is the top core, and therefore each of the through-holes 311–316 open externally. Each through-hole 311–316 includes an interior perimeter that comprises a conductive material formed therein by any technique such as electroplating. On the outside surface (i.e. the top and bottom) of each through-hole, a via land having an annular shape is formed by the same electro-plating process. The pattern exhibited by the through-holes 311–316 corresponds directly to the pattern of the pads 150 and 155 on the carrier sheet 100. The pattern defined by the through-holes is termed a "grid" and the grid spacing is defined as the distance between the through-holes. The grid spacing may be very fine (e.g. 8 to 10 mils) or larger (e.g. 20 to 25 mils and up).

A second core 302 shows five through-holes including a first through-hole 321, a second through-hole 322, a third through-hole 323, a fourth through-hole 324 and a fifth through-hole 325, all of which line up with corresponding through-holes in the first core 301. However, it may be noted that the first through-hole 316 in the first core 301, does not have a corresponding through-hole in the second core 302. Therefore, the sixth through-hole 316 extends only through the first core in accordance with the design criteria.

A third core 303 includes a first through-hole 331, a second through-hole 332 and a third through-hole 333. The through-holes 331, 332 and 333 line up with corresponding through-holes 321, 322 and 323 in the second core. However, in the second core, the fourth through-hole 324 and the fifth through-hole 325 do not have corresponding through-holes to mate in the third core, and therefore, the fourth and fifth through-holes do not continue into the third core 303.

Figure 10:
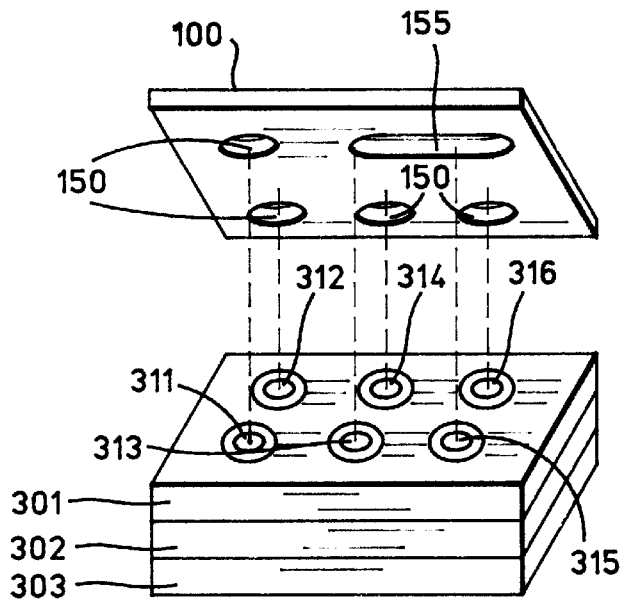
FIG. 10 is a perspective view of the plurality of cores aligned together, illustrating the positioning pads on the carrier sheet.

Reference is now made to FIG. 10 which shows the first core 301 aligned with the second core 302 and the third core 303 positioned together. The disk-shaped pads 150 on the carrier sheet 100 will be connected to the externally-opening through-holes 311, 312, 314, and 316 as shown with the dotted lines, and the cigar-shaped pad 155 will be connected over two externally-opening through-holes 313 and 315.

Figure 11:
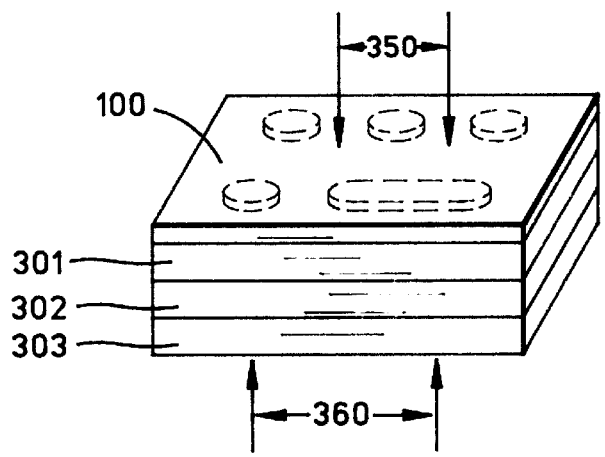
FIG. 11 is a perspective view of the carrier layer aligned with the aligned cores for lamination.
Figure 15:
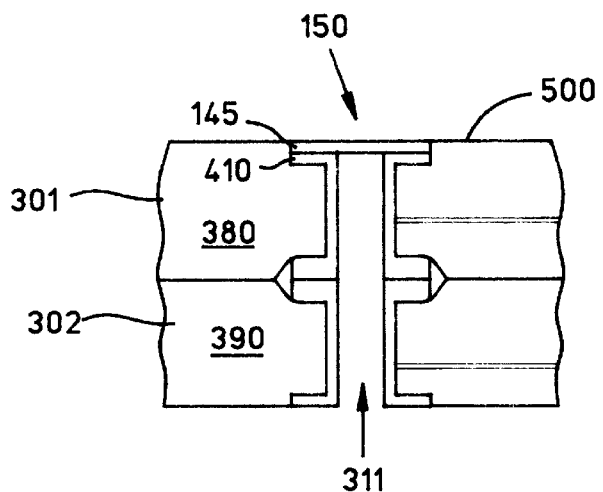
FIG. 15 is a cross-section of a plurality of cores subsequent to lamination in which the pad has been compressed to a position where the top surface of the pad is flush with the top surface of the dielectric layer of the top core.

Reference is now made to FIG. 11, in which the carrier layer 100 is positioned in alignment with the first core 301, 302 and 303. The structure in FIG. 11 is ready for lamination. During the lamination process, pressure is applied and the pressure is applied in the direction illustrated downwardly by arrows 350 and upwardly by arrows 360. Lamination includes bonding the pads 150 to the via lands, to cover the through-holes in the first core 130. In some embodiments, sufficient pressure is applied to compress the through-holes and pad structures so that the top surface of the pads are flush with the dielectric layer, as illustrated in FIG. 15 and discussed in more detail therewith.

Figure 12:
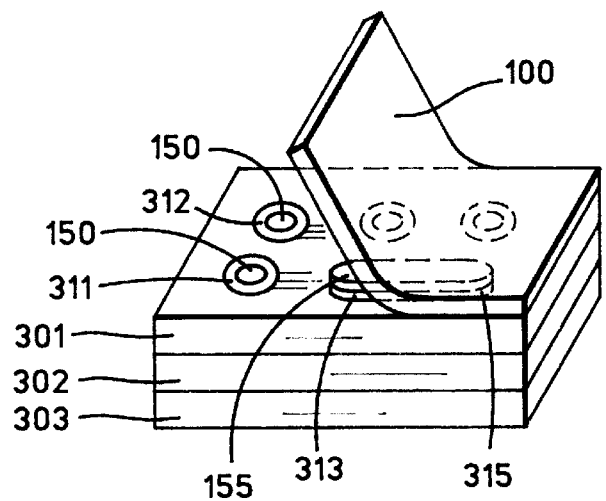
FIG. 12 is a perspective view of the capped multilayer circuit, illustrating the carrier layer being peeled away.

FIG. 12 shows the capped multilayer circuit board subsequent to lamination. The carrier sheet 100 is illustrated being peeled away to reveal the first and second through-holes 311 and 312 each capped by one of the disk-shaped pads 150. The elongated pad 155 covers both the third through-hole 313 and the fifth through-hole 315.

A preferred joining process for the multilayer circuit board is illustrated in U.S. Pat. No. 5,359,767 to Chen et al., entitled "Method of Making Multilayered Circuit Board", assigned to the same assignee as the present invention, and incorporated by reference herein. The Chen et al. patent describes a method that utilizes Transient Liquid Bonding (TLB) techniques to bond the cores together. As disclosed in Chen et al., the lamination process for the multilayer structure includes precisely aligning the through-holes and then compressing them at a predetermined pressure (e.g. 300 psi). The compressed structure is then heated to a first temperature (e.g. 300° C.) for an established time period, resulting in formation of an initial bond between the two through-holes. The resulting alloy formed from this initial bond possesses a melting point significantly greater than that of the subassembly dielectric (e.g. PTFE). Following this time period, the compressed subassemblies are again heated to a second, even greater temperature (e.g. 380° C.) for a second established time period sufficient to assure dielectric flow within the multilayer structure. The subassembly is then cooled and the pressure removed. The method disclosed by Chen et al. promotes effective engagement between respective pairs of through-holes in the compressed cores; and prevents dielectric incursion through the bond formed between the respective aligned through-holes that could otherwise adversely affect the electrical connection between adjacent cores.

Although in a preferred embodiment, lamination is performed according to TLP (Transient Liquid Phase) bonding using gold-tin as the bonding metals, it should be recognized that in other embodiments, different electrical interconnect technologies could be utilized. For example, SnPb: eutectic, SnPb: high temperature, gold-indium TLP, solder pastes and conductive adhesive processes could be used. Process considerations for choosing alternative technologies include maintaining thermal compatibility of the electrical interconnect technology, the mechanical bonding technology, and the dielectric material. The choice of materials, in some cases, can limit the alternatives which may be employed for electrical and mechanical interconnection.

Figure 13:
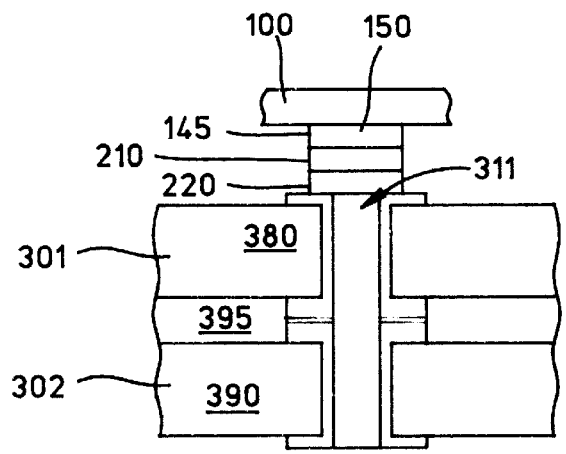
FIG. 13 is a cross-section of a plurality of cores, a through-hole through the cores, and the pad in position on top of the through-hole before lamination.

Reference is now made to FIG. 13, which is a cross-section of a through-hole and a pad 150 in position in alignment with the first through-hole 311 prior to the lamination process. As can be seen, the via lands on both sides of the dielectric material 380 and 390 that surround the through-hole 311 are not yet compressed, and dielectric material 380 in the first core 301 is separated from dielectric material 390 in the second core 302 by a space illustrated at 395.

Figure 14:
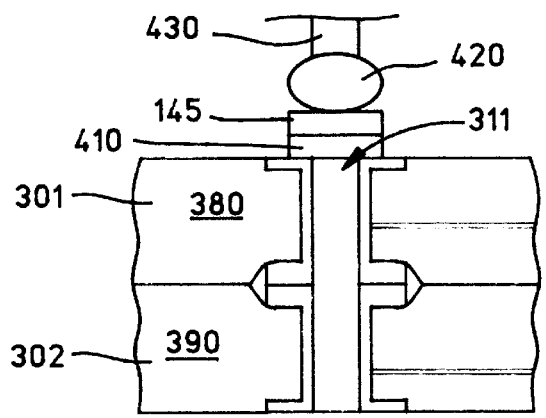
FIG. 14 is a cross-section of a plurality of cores subsequent to lamination, illustrating a capped through-hole in the multilayer structure and a solder ball and electrical component connected therewith.

Reference is now made to FIG. 14 which is a cross-section of the through-hole 310 subsequent to lamination. The first core 301 and the second core 302 have been compressed together and the via lands for the through-hole 311 have been joined electrically. The dielectric material 380 in the first core is now compressed against the dielectric material 390 in the second core. The carrier layer 100 has been peeled away, exposing the copper surface 145 which is connected to the through-hole 311 with an alloy 410 formed by the combining the gold and tin layers 210 and 220 during the application of heat and pressure of lamination. The resulting alloy layer 410 is conductive and is bonded to the through-hole 311 to provide electrical connection therewith. The copper layer 145 remains intact on top of the alloy layer 410, and provides a mounting pad for electrical components. For example, a solder ball 420 connects an electrical component 430 with the copper layer 145.

Reference is made to FIG. 15 which is an alternative embodiment of the capped through-hole 311, in which the top surface of the copper layer 145 of pad 150 is positioned flush with the top surface 500 of the dielectric layer 380 of the first (upper) core 301. In FIG. 15, the pad 150 has been pushed flush into the dielectric layer 380 by a combination of heat and pressure applied during the lamination process of the multilayer structure, in a predetermined process that would be apparent to one of ordinary skill in the art from the teachings herein. A flush pad has advantages during later processing of the multilayer circuit board, including allowing a thinner soldermask to be placed over the pads, which provides easier resolution of features.

The present invention is useful for forming metallized features on many types of printed circuit boards, including single layer printed circuits as well as the multilayer circuit boards made from multiple cores described herein. Other embodiments and modifications of this invention may occur to those of ordinary skill in the art in view of these teachings. For example, the pads may be formed on the carrier sheet using other processes, such as subtractive processes. Also, in some embodiments, one or more pads may attach to features other than through-holes. Therefore, this invention is to be limited only by the following claims, which include all such embodiments and modifications when viewed in conjunction with the above specification and accompanying drawings.

We claim:

1. A method for attaching pads to a high density printed circuit board having a plurality of through-holes opening on the top surface, comprising the steps of:
   a) forming a plurality of pads in a predetermined pattern on a carrier layer so that each of said pads have a copper layer proximate to said carrier layer and a joining metal layer formed on top of said copper layer;
   b) positioning the plurality of pads on the carrier layer so that they are aligned with the through-hole pattern on the top surface of the circuit board;
   c) bonding the pads to the through-holes on the top surface using the joining metal layer for said bonding; and
   d) after step (c) separating the carrier layer from the plurality of pads that are bonded to the through-holes, so that the copper layer is exposed.

2. The method of claim 1 wherein said step (a) includes sputtering and electroplating copper on the carrier layer.

3. The method of claim 1 wherein said carrier layer comprises polyimide.

4. The method of claim 1 wherein said carrier layer comprises stainless steel.

5. The method of claim 1 wherein said step (a) comprises electroplating the joining metal layer.

6. The method of claim 5 wherein said joining metal layer comprises gold and tin films.

7. The method of claim 1 wherein said step of bonding comprises a transient liquid phase (TLP) process.

8. The method of claim 7 wherein said joining metal layer comprises gold and tin films and said TLP process comprises heating said gold and tin films to form a gold-tin alloy.

9. The method of claim 1 wherein said printed circuit board defines a top surface comprising a dielectric material, and said step (c) includes compressing the plurality of pads into the printed circuit board so that the outermost surface of said plurality of pads is flush with the top surface of the dielectric layer in the printed circuit board.

10. The method of claim 1 further comprising the step of mounting an electrical component to at least one of said plurality of pads.

11. The method of claim 10 wherein said step of mounting an electrical component comprises applying a solderball.

12. The method of claim 1 wherein at least one of said plurality of pads has a shape for covering at least two through-holes in said printed circuit board, and said bonding step includes bonding said pad to said at least two through-holes.

13. A method for forming a high density multilayer printed circuit board having a plurality of through-holes opening on the top surface, comprising the steps of:
   a) forming a plurality of pads in a predetermined pattern on a carrier layer so that each of said pads have a copper layer proximate to said carrier sheet and a joining metal layer formed on top of said copper layer;
   b) aligning a plurality of preformed core circuit boards having a predefined through-hole pattern, said plurality of boards including a top board having a top surface having externally-opening through-holes;
   c) positioning the plurality of pads on the carrier layer so that they are aligned with the through-hole pattern on the top surface;
   d) bonding the pads to the through-holes on the top surface using the joining metal layer and simultaneously laminating the plurality of boards to provide a multilayer structure;
   e) separating the carrier layer from the plurality of pads that are joined to the through-holes, so that the copper layer is exposed.

14. The method of claim 13 wherein said step (a) includes sputtering and electroplating copper on the carrier layer.

15. The method of claim 13 wherein said carrier layer comprises polyimide.

16. The method of claim 13 wherein said carrier layer comprises stainless steel.

17. The method of claim 13 wherein said step (a) comprises electroplating the joining metal layer.

18. The method of claim 17 wherein said joining metal layer comprises gold and tin films.

19. The method of claim 13 wherein the steps of bonding and laminating comprise a transient liquid phase (TLP) process.

20. The method of claim 19 wherein said joining metal layer comprises gold and tin films and said TLP process comprises heating said gold and tin films to form a gold-tin alloy.

21. The method of claim 13 wherein said multilayer circuit defines a top surface comprising a dielectric material, and said step (d) includes compressing the plurality of pads into the multilayer structure so that the outermost surface of said plurality of pads is flush with the top surface of the dielectric layer in the resulting multilayer structure.

22. The method of claim 13 further comprising the step of mounting an electrical component to at least one of said plurality of pads.

23. The method of claim 13 wherein said step of mounting an electrical component comprises applying a solderball.

24. The method of claim 13 wherein at least one of said plurality of pads has a shape for covering at least two through-holes in said multilayer structure, and said bonding step includes bonding said pad to said at least two through-holes.

25. A method for attaching pads to a high density multilayer printed circuit board having a plurality of through-holes opening on the top surface, comprising the steps of:
   a) forming a plurality of pads on a carrier layer, including the substeps of
   a.i) depositing a copper surface layer on the carrier layer to provide a copper-surfaced carrier layer,
   a.ii) applying photoresist to the copper-surfaced carrier layer,
   a.iii) exposing said photoresist on the copper-surfaced carrier layer to light with a predetermined pad pattern,
   a.iv) developing and washing the exposed photoresist from step a.iii to provide a plurality of exposed copper layer areas having the predetermined pad pattern;
   a.v) depositing copper pads on the plurality of exposed copper layer areas,
   a.vi) depositing a joining metal layer on each copper pad deposited in the previous step, and a.vii) stripping the resist layer and the copper layer, except copper layer portions under the pads, from the carrier layer;

b) positioning the plurality of pads on the carrier layer so that they are aligned with the through-hole pattern on the top surface of the multilayer circuit board;

c) bonding the pads to the through-holes on the top surface using the joining metal layer; and d) separating the carrier layer from the plurality of pads that are joined to the through-holes.

26. The method of claim 25 wherein said carrier layer comprises a peelable polyimide layer.

27. The method of claim 25 wherein said carrier layer comprises a peelable stainless steel layer.

28. The method of claim 25 wherein said step a.vi comprises electroplating the joining metal layer.

29. The method of claim 25 wherein said joining metal layer comprises gold and tin films.

30. The method of claim 25 wherein said steps of bonding and laminating comprise a transient liquid phase (TLP) process.

31. The method of claim 30 wherein said joining metal layer comprises gold and tin films and said TLP process comprises heating said gold and tin films to form a gold-tin alloy.

32. The method of claim 25 wherein said multilayer circuit defines a top surface comprising a dielectric material, and said step (c) includes compressing the plurality of pads into the multilayer structure so that the outermost surface of said plurality of pads is flush with the top surface of the dielectric layer in the resulting multilayer structure.

33. The method of claim 25 further comprising the step of mounting an electrical component to at least one of said plurality of pads.

34. The method of claim 33 wherein said step of mounting an electrical component comprises applying a solderball.

35. The method of claim 25 wherein at least one of said plurality of pads has a shape for covering at least two through-holes in said multilayer structure, and said bonding and laminating steps include bonding said pad to said at least two through-holes.

36. A method of forming a multilayer printed circuit board comprising the steps of:

forming a plurality of core printed circuit boards (PCBs) including a top core having a top surface that has a plurality of exposed through-holes;

forming a plurality of pads in a predetermined pad pattern on a peelable carrier layer;

aligning said core PCBs with respect to each other in interconnectable formation;

aligning said predetermined pad pattern in alignment with said top surface;

heating and compressing said core PCBs and plurality of pads; and peeling away the carrier layer to provide a multilayer PCB board having pads over the through holes in the top surface.

37. A method for attaching pads to a circuit board having a plurality of conductive sites arranged in a predetermined pattern at a top surface of the circuit board, comprising the steps of:

forming a plurality of pads on a top surface of a carrier layer so that first ends of the pads are releasable from the carrier layer when the carrier layer is pulled from the first ends of the pads and so that second ends of the pads are in a pattern that match at least a portion of said plurality of conductive sites at the top surface of the circuit board;

positioning the carrier layer so that said second ends of the pads engage said at least a portion of the plurality of conductive sites;

bonding the second ends of the pads to said at least a portion of the conductive sites; and pulling the carrier layer from the first ends of the pads leaving the second ends of the pads bonded to the conductive sites and the first ends of the pads exposed and extending from said at least a portion of the conductive sites.

38. A method as claimed in claim 37 wherein the carrier layer is flexible.

39. A method as claimed in claim 38 wherein the carrier layer is polyimide.

40. A method as claimed in claim 38 wherein the carrier layer is stainless steel.

41. A method as claimed in claim 37 wherein each conductive site includes a through-hole through the circuit board with a conductive sleeve disposed therein, each conductive sleeve having an edge that is substantially flush with the top surface of the circuit board.

42. A method as claimed in claim 37 wherein each pad is multilayered with a first layer being copper and a second layer being a bonding layer, the copper layer providing one of said first ends and the bonding layer providing one of said second ends.

43. A method as claimed in claim 42 wherein the bonding layer is multifilmed with a first film being gold and a second film being tin.

44. A method as claimed in claim 37 wherein the step of bonding includes heating the pad until the pad joins with one or more conductive sites.

45. A method as claimed in claim 44 wherein, in addition to heating, the step of bonding includes pressure applied between the pads and the circuit board.

46. A method as claimed in claim 45 wherein said circuit board includes a dielectric material and the pressure and heating compresses the pads into the dielectric material of the circuit board so that the first surfaces of the pads are flush with the top surface of the circuit board.

47. A method as claimed in claim 37 wherein the step of forming said plurality of pads comprises the steps of:

forming a thin copper layer on the carrier layer;

forming a photoresist pattern on the copper layer with openings exposing portions of the thin copper layer at sites for said plurality of pads;

electroplating a thick copper layer on each exposed portion of the thin copper layer;

electroplating a bonding material layer on each of the thick copper layers to form said pads;

removing the photoresist pattern; and etching away the thin copper layer except at said sites thereby leaving pads of copper and bonding material extending from said carrier layer.

48. A method as claimed in claim 47 wherein said electroplating a bonding material layer includes electroplating multifilms wherein a first film is gold and a second film is tin.

49. A method as claimed in claim 48 wherein the carrier layer is flexible.

50. A method as claimed in claim 49 wherein the step of bonding includes heating the pad until the pads bond with one or more conductive sites.

51. A method as claimed in claim 50 wherein in addition to heating the step of bonding includes pressure applied between the pads and the circuit board.

52. A method as claimed in claim 51 wherein said circuit board includes a dielectric material and the pressure and heating compresses the pads into the dielectric material of the circuit board so that the first surfaces of the pads are flush with the top surface of the circuit board.

53. A method as claimed in claim 51 wherein:

each conductive site includes a through-hole through the circuit board with a conductive sleeve disposed therein, each conductive sleeve having an edge that is substantially flush with the top surface of the circuit board; and said bonding bonds the pads to one or more edges of the conductive sleeve.

54. A method as claimed in claim 51 wherein the carrier layer is polyimide.

55. A method as claimed in claim 51 wherein the carrier layer is stainless steel.

* * * * *